United States Patent [19]

Bauer et al.

[11] Patent Number: 5,252,427
[45] Date of Patent: Oct. 12, 1993

[54] POSITIVE PHOTORESIST COMPOSITIONS

[75] Inventors: Richard D. Bauer, Kennett Square, Pa.; Gwendyline Y. Y. Chen, Wilmington, Del.; William L. Hamilton, Chesapeake City, Md.

[73] Assignee: E. I. Du Pont de Nemours and Company, Wilmington, Del.

[21] Appl. No.: 917,924

[22] Filed: Jul. 21, 1992

Related U.S. Application Data

[63] Continuation of Ser. No. 508,023, Apr. 10, 1990, abandoned.

[51] Int. Cl.$^5$ .............................................. G03C 1/492
[52] U.S. Cl. ..................... 430/270; 430/311; 430/325
[58] Field of Search ................ 430/270, 325, 326, 311

[56] References Cited

U.S. PATENT DOCUMENTS

| | | | |
|---|---|---|---|
| 3,779,778 | 12/1973 | Smith et al. | 5a/115 R |
| 4,193,797 | 2/1979 | Cohen et al. | 430/258 |
| 4,345,020 | 8/1982 | Yoneda et al. | 430/270 |
| 4,491,628 | 1/1985 | Ito et al. | 430/176 |
| 4,673,458 | 6/1987 | Ishikawa et al. | 156/659 |
| 4,822,719 | 4/1989 | Schneller et al. | 430/270 |
| 4,883,740 | 11/1989 | Schwalm et al. | 430/270 |
| 4,912,018 | 3/1990 | Osuch et al. | 430/270 |
| 5,023,164 | 6/1991 | Brunsvold et al. | 430/270 |

FOREIGN PATENT DOCUMENTS

| | | | |
|---|---|---|---|
| 672947 | 10/1963 | Canada | 401/61 |
| 0264908 | 10/1987 | European Pat. Off. | |

OTHER PUBLICATIONS

Printed Circuits Handbook, Coombs, CLyde F., Jr., 1979 Chapter 6, pp. 6-1 through 6-30.
Photoresist Materials and Processes, DeForest, W. S., 1975 Chapter 5, pp. 132-162.
Polymers and Copolymers of Unsaturated Tetrahydropyranyl Esters, Julie E. Kearns, et al., 1974; pp. 673-685.

*Primary Examiner*—Jack P. Brammer

[57] ABSTRACT

The present invention provides an aqueous-processable, positive-working photoresist composition having improved photospeed and aqueous development rate without substantially reducing processing latitude in printed circuit chemistries. The compositions contain (a) a polymeric material having a polymer backbone with pendant acid labile groups which are bound directly or indirectly to the polymer backbone, and free acid groups, wherein the polymeric material has an acid number of about 25 and is substantially insoluble in 1% by weight aqueous sodium carbonate solution at 30° C., and (b) a substance that forms an acid upon exposure to actinic radiation. The positive photoresists of this invention may be used to prepare printed circuits wherein the photoresist may be applied to the printed circuit substrate as a liquid coating, as a solid, dry film or from an electrodeposition bath.

12 Claims, No Drawings

POSITIVE PHOTORESIST COMPOSITIONS

This is a continuation of application Ser. No. 07/508,023 filed Apr. 10, 1990, now abandoned.

FIELD OF THE INVENTION

This invention be directed to photosensitive compositions containing polymeric components having acid labile groups and a photogenerating acid component. More particularly, this invention relates to positive working photoresist compositions for use in making printed circuits.

BACKGROUND OF THE INVENTION

The production of printed circuits using a variety of resists is described in "Printed Circuits Handbook" edited by Clyde F. Coombs, Second Edition, published by McGraw-Hill, Inc., 1979. Chapter 6 of this publication describes the use of both negative-working and positive-working photoresists in the preparation of printed circuits. In particular, section 14 of chapter 6 discusses conventional positive-working liquid photoresists and section 16 discusses conventional coating methods applying such photoresists to printed circuit substrates. Likewise, the production of printed circuits using photoresists is described in "Photoresist Materials And Processes" by W. S. DeForest published by McGraw-Hill Book Company, 1975. Namely, Chapter 5 of this publication discusses conventional positive resists and the processes of their use in manufacturing printed circuits.

U.S. Pat. No. B1 4,193,797 discloses a dry film process for forming a photoresist comprising applying to a surface of a solid unexposed photosensitive layer of thermoplastic photosoluble or photodesensitizable material, the other surface being releasedly adhered to a film support, exposing the layer to actinic radiation, and removing the film support, and then washing away exposed areas of the layer to uncover areas of the underlying surface. The uncovered areas of the underlying surface can be etched, plated or otherwise modified. The photoactive materials disclosed are photosoluble o-quinonediazides and photodesensitizable bis-diazonium salt compositions.

An electrocoating process is disclosed in U.S. Pat. No. 4,673,458 wherein a positive working photoresist is applied to a printed circuit substrate by electrodeposition with an anionic or cationic electrodeposition bath of quinonediazide sulfonic ester bearing acrylic copolymer. An anionic, positive working photosensitive resin composition is disclosed which is a copolymer having a neutralized, acidic component and an o-quinonediazide ester component. The neutralized polymer obtained is dispersed into water.

In U.S. Pat. No. 3,779,778, novel photosolubilizable compositions are disclosed that comprise 1) a water-insoluble compound containing one or more acid-degradable groups, and 2), a photoinitiator comprising a photolyzable acid progenitor. The useful water-insoluble compounds can contain one or more acid-degradable linkage which can be formed by the nucleophilic reaction of phenols, N-alkyl arylsulfonamides, or certain secondary amines with alkyl vinyl ethers, e.g., methyl vinyl ether, ethyl vinyl ether or a dihydropyran.

J. E. Kearns et al., J. Macromol. Sco.-Chem., A8(4), pp. 673-685 (1974) describe the preparation and deesterification of a number of polymers and copolymers of unsaturated tetrahydropyranyl esters. The utility of dihydropyran as a protecting group in the preparation of polymers containing other groups susceptible to normal hydrolysis conditions is ascribed to the mild conditions required to remove the tetrahydropyranyl group from these esters. In U.S. Pat. No. 4,491,628, resists sensitive to UV, electron beam and x-ray radiation with positive or negative tone upon proper choice of a developer are formulated from a polymer having a recurrent pendant groups such as tert-butyl ester or tert-butyl carbonate groups that undergo efficient acidolysis with concomitant changes in polarity (solubility) together with a photoinitiator which generates acid upon radiolysis. A sensitizer component that alters wavelength sensitivity of the composition may also be added. The preferred acid labile pendant groups are tert-butyl esters of carboxylic acids and tert-butyl carbonates of phenols. It is understood that a wide range of acid labile groups are operative in the invention including trityl, benzyl, benzhydryl modifications as well as others well known in the art.

European Patent Application 0 264 908 discloses resists comprised of at least one polymer, copolymer, or terpolymer having recurrent acid labile groups pendant to the polymer backbone wherein the improvement comprises: selecting a substituent side chain on said acid labile groups which is capable of forming secondary carbonium ion intermediates and having an available proton adjacent to the carbonium ion formed during cleavage. The autodecomposition temperature of the polymer comprising the photoresist is increased to a temperature greater than about 160° C., by selecting substituent side chains on the acid labile group which exhibit a less stable intermediate carbonium ion than the t-butyl ion.

Canadian Patent No. 672,947 discloses novel coating compositions comprising, essentially, a tetrahydropyranyl ester of a linear copolymer of an $\alpha,\beta$- ethylenically unsaturated carboxylic acid, a glycidyl ester of such an acid and at least one other ethylenically unsaturated monomer free of groups reactive with epoxide rings and carboxylic acid groups, which compositions when applied and heated are converted into hard thermoset, solvent resistant films via the crosslinking reaction of the carboxylic acid and epoxide groups.

Although there are a number of positive working photoresist systems based on polymers with acid labile groups and acid generating photosensitive initiators, such systems typically have low photospeed and have limited processing latitude in wholly aqueous solutions in the absence of organic solvent additives. There is a need in the industry for higher photospeed and all aqueous processing in such systems without affecting processing latitude.

SUMMARY OF THE INVENTION

The present invention provides an aqueous-processable, positive-working photoresist composition comprising:
  a) a polymeric material having
    (1) pendant acid labile groups and
    (2) free acid groups,
    wherein the polymeric material has an acid number of at least 25 and an adherent coating of said polymeric material in a thickness of within a range of 0.00025 to 0.005 inch on a substrate takes at least 1 minute to be removed when sprayed at 25 to 30 p.s.i. with 1% by weight aqueous sodium carbonate solution at 30° C., and b) a substance that forms an acid upon exposure to actinic radiation.

The present invention also provides a method for forming a positive photoresist image on a substrate surface the method comprising:

A) applying to said surface a layer of a photoresist composition comprising:
  a) a polymeric material having
    (1) pendant acid labile groups and
    (2) free acid groups,
    wherein the polymeric material has an acid number of at least 25 and an adherent coating of said polymeric material in a thickness of within a range of 0.00025 to 0.005 inch on a substrate takes at least 1 minute to be removed when sprayed at 25 to 30 p.s.i. with 1% by weight aqueous sodium carbonate solution at 30° C., and
  b) a substance that forms an acid upon exposure to actinic radiation,
B) exposing the layer, imagewise, to actinic radiation to form exposed image areas in the layer,
C) removing the exposed areas of the layer with an aqueous alkaline solution having a pH of at least 9.8 to uncover substrate surface areas, and
D) modifying the uncovered substrate surface areas by etching or depositing a material thereon.

DETAILED DESCRIPTION OF THE INVENTION

The positive-working photosensitive compositions of this invention have improved photospeed and aqueous development rate, surprisingly, without substantially reducing processing latitude in printed circuit chemistries. Furthermore, imaged photoresist masks can be completely stripped in wholly aqueous alkaline solutions without re-exposure and without leaving resist residues. The compositions of this invention possess improved characteristics in spite of the fact that the same polymeric component contains both free acid groups and acid labile groups. In addition to the two essential components, the compositions of this invention may also include plasticizers, surfactants, colorants and other adjuvants useful for a particular resist application. Although the compositions of this invention may be used in any positive resist application, such as microelectronic lithography, they are particularly useful as primary resists to manufacture printed circuit boards where the resist either is laminated as a preformed, dry film or is electrophoretically deposited.

Polymeric Material

The polymeric material has a polymer backbone with pendant acid labile groups which are bound directly or indirectly to the polymer backbone and free acid groups. The polymeric material has an acid number of about 25 or greater and 0.00025 to 0.005 inch thick coatings of the material take more than 1 minute to be removed when sprayed at 25 to 30 p.s.i. with 1% by weight aqueous sodium carbonate solution at 30° C. The acid number may be as high as 300 or greater but typically it is 100 or less. The useful acid number range for a particular polymeric material may be a factor of the glass transition temperature ($T_g$) of the material and the presence in the final photosensitive composition, of plasticizers or other such components.

The polymeric materials of the present invention are made by methods known in the art. The polymers can be prepared by free radical polymerization, Group Transfer polymerization, or by other polymerization methods known in the art. The pendant acid labile groups and/or the free acid groups may be selectively attached to the polymer backbone as part of the monomeric components used to form the backbone or after the backbone has been formed. Typically, monomeric components each containing an acid labile group or a free acid group (or sites to which such groups may be later attached) are copolymerized in suitable proportions to produce the polymeric material. Additional conventional monomer components may be incorporated in the copolymerization process to further modify polymeric material characteristics, e.g., to change the hardness, $T_g$, and the like.

Pendant acid labile groups useful in the compositions of this invention include isobornyl esters; alpha-alkoxy alkyl esters; secondary and tertiary alkyl esters such as disclosed in U.S. Pat. No. 4,491,628 and European Patent Application 87108644.3; silyl esters such as disclosed in U.S. Pat. No. 4,820,607; and the like. Preferred pendant acid-labile groups are unsubstituted and substituted isobornyl and norbornyl esters wherein substitution is by one or more alkyl or alkoxy groups having 1 to 4 carbon atoms, and alpha-alkoxy alkyl ester groups represented by the formula:

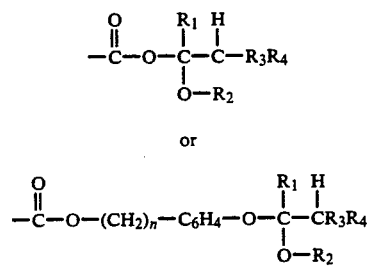

where n is 0 to 4; $R_1$ is hydrogen or lower alkyl of 1 to 6 carbon atoms; $R_2$ is lower alkyl; and $R_3$ and $R_4$ independently are hydrogen or lower alkyl where the definition of lower alkyl includes alkyl groups having 1 to 6 carbon atoms and the joining of $R_1$ and $R_2$or $R_1$; and either $R_3$ or $R_4$, or $R_2$ and either $R_3$ or $R_4$ to form a 5-, 6-, or 7-membered ring. The following monomeric components fall within the scope of the invention when used to prepare the polymeric material: 6-isobornyl methacrylate (or acrylate), 1-ethoxyethyl methacrylate (or acrylate), 1-butoxyethyl methacrylate (or acrylate), 1-ethoxy-1-propyl methacrylate (or acrylate), tetrahydropyranyl methacrylate (or acrylate), tetrahydropyranyl p-vinylbenzoate, 1-ethoxy-1-propyl p-vinylbenzoate, tetrahydropyranoxy-4-benzyl methacrylate (or acrylate), 1-butoxyethoxy-4-benzyl methacrylate (or acrylate).

Also useful as the pendant acid labile group are tert-butyl methacrylate (or acrylate), tetrahydropyranoxy-4-styrene, 1-butoxyethoxy-4-styrene and the like, The free acid groups may be a carboxylic acid, a phosphoric acid or a phenolic group. The free acid group preferably has a pKa of at least about 2. Of the acids the carboxylic acid group is preferred. The following monomeric components fall within the scope of the invention when used to prepare the polymeric material: acrylic acid; methacrylic acid; maleic acid, half ester or half amide; fumaric acid, half ester or half amide; itaconic acid, half ester or half amide; mono(2-hydroxyethyl [meth]acrylate) acid phosphate; 2-[meth]acryloxyethyl phosphonic acid; 2-[meth]acryloxyethyl phosphinic acid; 2-[meth]acryloxypropyl phosphonic acid; 2-[meth]acryloxypropyl phosphinic acid; p-hydroxy styrene; p-hydroxy benzyl acrylate or methacrylate and the like.

Additional conventional monomer components which may be used to modify the polymeric material include acrylic alkyl esters such as methyl methacrylate; ethyl methacrylate; propyl methacrylate; butyl methacrylate; benzyl methacrylate; methyl acrylate; ethyl acrylate; propyl acrylate; butyl acrylate and the like; acrylic alkyl amides such as N-butylacrylamide; N-octylacrylamide and the like; acrylonitrile; styrene; p-methyl styrene; butadiene; isoprene and the like. Preferred monomers are methyl methacrylate, ethyl acrylate, and butyl acrylate.

The polymeric material of this invention may be a copolymer of the acid labile monomer (AL) and and the free acid monomer (FA) but typically it is an interpolymer containing one or more conventional monomers (CM). The actual ratios of the monomers within a polymeric material may vary widely depending on the nature of the monomers as well as the polymeric molecular weight distribution. Thus in the monomer ratio of AL:FA:CM AL may vary from 96 to 20, FA may vary from 4 to 15 and CM may vary from 0 to 76, but other ratios may likewise be useful provided they have an acid number of about 25 or greater and 0.00025 to 0.005 inch thick coatings of the material take more than 1 minute to be removed when sprayed at 25 to 30 p.s.i. with 1% sodium carbonate solution at 30° C. Preferred polymeric materials that meet these criteria are: poly(ethyl acrylate/isobornyl methacrylate/methacrylic acid)(54/36/10) and poly(methyl methacrylate/ethyl acrylate/1-butoxyethyl methacrylate/methacrylic acid)(19.5/35.5/35/10) to (26.8/33.2/35/5).

Photosolubilizing Agent

The photoactive component of the photoresist compositions of this invention, i.e., the photosolubilizing agent, is a substance that forms an acid upon exposure to actinic radiation. When activated by actinic radiation, the photosolubilizing agent furnishes the acid that catalyzes decomposition of the acid-labile components of the polymeric material. The agent may do so directly, or it may be a system wherein the sensitizer causes the agent to liberate acid when exposed. In effect, the substance that forms an acid upon exposure to actinic radiation is a photoinitiator or photoinitiating system which, upon exposure to the actinic radiation, generates a catalytic amount of a strong acid, typically with a pKa equal to or less than 2.

Examples of compounds and mixtures which can be used as photosolubilizing agents include diazonium, phosphonium, sulfonium and iodonium salts; halogen compounds; o-quinone diazide-4-sulfochlorides; aryl naphthoquinone diazide-4-sulfonates; organometal/organohalogen combinations; benzoin and o-nitrobenzyl esters of strong acids, e.g., toluene sulfonic acid; and N-hydroxy amide and imide sulfonates as disclosed in U.S. Pat. No. 4,371,605. Preferred photosolubilizing agents are the diaryliodonium or triarylsulfonium salts. These are generally present in the form of salts with complex metal halides ions such as tetrafluoroborate, hexafluoroantimonate, hexafluoroarsenate, and hexafluorophosphate.

It may be desirable to add a sensitizer to the system to adjust the spectral sensitivity to the available wavelength of actinic radiation. The need will depend on the requirements of system and the specific photosensitive compound used. For example, iodonium and sulfonium salts only respond to wavelengths below 300 nm. These compounds may be sensitized to longer wavelengths using benzophenone and derivatives thereof, polycyclic aromatic hydrocarbons such as perylene, pyrene, and anthracene, and derivatives thereof. The decomposition of diaryliodonium and triarylsulfonium salts has also been sensitized by bis-(p-N,N-dimethylaminobenzyliden)-acetone. Anthracene bound sulfonium salts, with chain lengths of three to four atoms, are efficient photosolubilizing agents. These compounds, which are disclosed in M. G. Tilley, Ph.D. Thesis, North Dakota State University, Frago, N. Dak. (1988) [Diss. Abstr. Int. B, 49, 3791 (1989); Chem. Abstr., 111, 39942u], are a preferred class of photosolubilizing agents. Another preferred photosolubilizing agent is ATASS, i.e., sulfonium, [4-[3-(9-anthracenyl)propyl]phenyl]diphenyl-, hexfluoroantimonate[-1]. In this compound the anthracene and the sulfonium salt are bonded by a three carbon chain.

The amount of photosolubilizing agent in the photoresist composition should generally be as low as possible without unduly sacrificing sensitivity, generally from about 0.1% to about 10% by weight of the photoresist composition. Less than about 0.1% generally lead to insensitive compositions while weight percentages greater than about 10% produce compatibility and control problems. For most acid-labile polymers, 0.5 to 6% by weight photosolubilizing agent in the photoresist composition is preferred.

Printed Circuit Manufacture

Photoresists are used in temporary coatings in a primary imaging process to make printed circuits. In practice, a photoresist layer, typically between 2.5 and 125 micrometers thick, is applied to a printed circuit substrate which typically is a copper clad fiberglass epoxy board. The applied photoresist layer is then imagewise exposed to actinic radiation to solubilize exposed areas. The exposed areas are then completely removed typically with a developer solution which selectively dissolves, strips or otherwise disperses the exposed areas without adversely affecting the integrity or adhesion of the unexposed areas. The surface areas of the substrate which were uncovered by the development process are then modified by etching or removing material therefrom or depositing a material thereon.

In the instance of primary imaging to form a printed circuit board, the uncovered copper surface areas may be etched or removed to form a printed circuit directly, or additional copper or other metal resistant to etchant, e.g., gold, tin/lead, etc., may be plated thereover. In the first instance, the unexposed resist is typically removed from the remaining copper surface by a stripping process involving re-exposure to actinic radiation followed by a second development operation to form the circuit board directly. In the second instance, the unexposed resist is first removed from the unplated copper surface which is then etched or removed from the substrate to form a plated printed circuit board. In both instances a second overall exposure is used to solubilize the remaining unexposed resists for removal under normal development conditions. However, the resists of this invention may be directly removed or stripped without a second overall exposure by treatment with alkaline stripping solution, typically with a pH of 12 or greater.

RESIST APPLICATION

The photosolubilizable resists may be applied to a printed circuit substrate either as a liquid, as a preformed dry film, or as a combination of a liquid and dry film or by electrodeposition.

COATING LIQUIDS

The photoresist may be coated as a liquid onto the printed circuit substrate using any conventional coating process. The liquid typically is a solution of the resist wherein the solvent is removed subsequent t°Coating to form a dry, solid, resist layer. The liquids may be rollercoated, spin-coated as in microelectronic applications, screen-coated or screenprinted as disclosed in Coombs supra, in DeForest supra, or in Oddi et al., U.S. Pat. No. 4,376,815. The solution may also be curtain coated as disclosed in Losert et al., U.S. Pat. No. 4,230,793.

Dry Film Lamination

A pre-formed, dry-film, photosolubilizable resist layer typically is applied from a multi-ply, transfer, resist element using the lamination process as described in U.S. Pat. No. B1 4,193,797. The multi-ply, resist element comprises, in order, a temporary support film, e.g., polyethylene terephthalate, a thin photosolubilizable resist layer, and optionally a removable cover sheet, e.g., polyethylene, to protect the resist element during storage. As described in the patent, the cover sheet, if present, is first removed and the uncovered photoresist surface is laminated to the surface of a copper clad printed circuit substrate using heat and/or pressure, e.g., with a conventional hot-roll laminator. Although the laminate may be imagewise exposed to actinic radiation through the temporary support film (when it is transparent to actinic-radiation), in most instances, where the photoresist layer is insensitive to ambient constituents and is not excessively tacky, the temporary support is removed before imaging to improve resolution and other such properties. In those instances where the resist is sensitive to visible radiation, an opaque temporary support is preferred to protect the resist layer during storage and handling. The opaque temporary support is removed just prior to imaging. In some instances resist adhesion to the substrate can be improved by treating the substrate surface with a liquid at or just prior to lamination. Typically, the liquid is insensitive to actinic radiation and may be a solution of adhesion promoters as disclosed in Jones, U.S. Pat. No. 3,645,772, a solvent or swelling agent for the resist layer as disclosed in Fickes. The liquid in some instances may be photosensitive such as the photoresist solutions disclosed in Isaacson U.S. Pat. No. 3,629,036.

Electrocoating Process

The positive-working photoresists may be applied to the copper clad printed circuit substrate by an anionic electrodeposition process such as described in U.S. Pat. No. 4,673,458. An anionic electrodeposition bath is first prepared by dispersing the photoresist of this invention in an aqueous medium. The photoresist composition is dissolved in a suitable organic solvent, such as methyl ethyl ketone. Free acid groups in the polymer are neutralized with base, such as an organic amine, e.g., triethyl amine, to extent sufficient to form an emulsion in water. Typically, for a polymer with an acid number of 30 to 50, 25 to 50% of the free acid groups are neutralized. The photoresist solution containing the neutralized polymer, initiator, and other optional modifiers is then dispersed in water by adding it slowly to water with rapid stirring. In order to apply the anionic photoresist to the copper metal on the circuit board substrate, a common electrophoresis means can be used in the present invention. The copper clad substrate, which may contain plaited through-holes, is dipped in an electrodeposition bath of the anionic, positive working photoresist composition of this invention, an anode is connected to the substrate, a cathode is placed in the bath, and direct current is flowed between the electrodes thereby depositing the anionic, positive working photoresist composition on the copper metal of the circuit board substrate. The circuit board substrate with the deposited photoresist composition thereon is then dried to form a continuous resist film ready for further processing.

To further illustrate the present invention the following examples are provided. All percentages and parts are by weight unless otherwise indicated.

EXAMPLE 1

This example illustrates the use of the photosoluble compositions of this invention as a dry film resist to prepare a printed circuit by the etching process.

A polymer, Poly(MMA/EA/BVEMA/MAA)(23.2/34.3/35/7.5 mole %) is synthesized by standard free-radical-initiated solution polymerization in methyl ethyl ketone, where MMA is methyl methacrylate, EA is ethyl acrylate, BVEMA is 1-butoxyethyl methacrylate, and MAA is methacrylic acid. The polymer has a number average molecular weight (MWn) of 7,780, a glass transition temperature ($T_g$) of about 15 and an acid number (Acd.#) of 52.2. Methyl ethyl ketone is added to adjust the polymer solution to 47% polymer by weight. Based on the polymer weight in the solution, 5% of Cyracure ® Photoinitiator UVI-6974 (a triaryl sulfonium hexafluoroantimonate manufactured by Union Carbide, New York) and 0.2% Sudan Blue dye is added. This solution is coated on a 0.001 inch polyethylene terephthalate film support and dried for one hour to give a dry photoresist layer with a thickness of about 0.0011 inch. The supported layer is applied to a conventionally cleaned G-10 copper-clad epoxy/glass printed wiring board laminate, with the photoresist layer contacting the copper surface, using a Du Pont HRL-24 laminator at a temperature of 105° F. and a rate of 1 meter per minute. After a one hour hold time, the laminated layer is exposed through a test target phototool to 200 mj/cm$^2$ UV radiation on a Du Pont PC-130 exposure unit. One hour after the exposure, the support film is removed and the photoresist is developed with 30° C., 1% Na$_2$CO$_3$ water solution in a Du Pont ADS-24 developer unit with a spray pressure about 30 p.s.i. The time used to develop the photoresist is 30 seconds which is twice the time needed to first uncover the copper surface in the developer unit. The resist holds 5-6 steps on a Stouffer 21 step square-root-of-two step wedge, and resolves 0.001 inch lines and spaces on a Stouffer converging resolution wedge.

The uncovered copper areas of the printed circuit laminate are then etched using conventional acid cupric chloride etchant. Areas protected by the photoresist survive etching and uncovered areas are etched down to the epoxy/glass laminate underlying the copper. The remaining resist is then stripped from the etched laminate by soaking briefly in 1 to 2% NaOH water solution.

EXAMPLE 2

A polymer, poly(MAA/EA/IBMA)(10/54/36 mole %) is synthesized by standard free-radical-initiated solution polymerization, where MAA and EA are as identified in Example 1 and IBMA is isobornyl methacrylate. The polymer has a weight average molecular weight (MWw) of 50,400, a $T_g$ of 51.5 and an acid number of 70.5.

A coating solution is prepared from 100 pbw (i.e., parts by weight) of the polymer, 10 pbw Cyracure® Photoinitiator UVI-6974, 4 pbw benzophenone, 1 pbw chlorothioxanthone, and 200 pbw methylene chloride. The solution is coated on a 0.001 inch thick polyethylene terephthalate film support at 0.0012 inch thickness and dried. The dried coating is laminated to the conventionally cleaned copper surface of a G-10 copper-clad laminate as described in Example 1. The laminated coating is then exposed on the PC-130 Printer to UV radiation passing through a phototool containing an opaque printed circuit image for a total exposure of 500 mj. The exposed laminate is then baked for 5 minutes at 120° C., the support film is removed, and the imaged laminate is developed as in Example 1 by removing exposed areas with a spray of 1% $Na_2CO_3$ in water solution at 30° C. Development is complete in 35 seconds to produce a strongly adherent resist image on the copper surface.

The uncovered copper areas are etched in 130° F. acid cupric chloride etchant standard to the PWB fabrication industry, and the resist stripped in 130° F. 2-4% NaOH in water solution to produce a high quality conductive printed circuit.

EXAMPLE 3

The process of Example 2 is repeated to produce a resist image on the copper surface except that the support film is removed from the laminated coating before imaging exposure and a phototool having a transparent circuit image is used so that the uncovered copper areas form the circuit image. The uncovered coppercircuit areas are then conventionally plated first with copper and then with tin/lead. The resist remaining on the plated board is then uniformly re-exposed to UV radiation on the PC-130 Printer for a 500 mj exposure, baked, and the resist removed in the 1% $Na_2CO_3$ developer solution. The uncovered copper substrate areas which are not protected by tin/lead plating are removed by etching as in Example 2 to produce a high resolution, conductive, printed circuit.

EXAMPLE 4

This example illustrates the use of the photosoluble compositions of this invention as an electrodeposited resist to prepare a printed circuit by the etching process. A polymer, Poly(MMA/EA/BVEMA/MAA)(31.7/25.8/35/7.5 mole %) is synthesized by standard free-radical-initiated solution polymerization, where MMA, EA, BVEMA and MAA have identities given in Example 1. The polymer has a number average molecular weight of 7,960, a $T_g$ of 25 and an acid number of 52.2.

An anionic electrodeposition bath is prepared as follows. 100 pbw of this polymer in 95 pbw methyl ethyl ketone is mixed with 5 pbw of benzoin tosylate initiator and 0.04 pbw Sudan Blue Dye. The polymer in the mixture is neutralized 75% with triethanolamine, and 4 pbw hexyl carbitol is added. Water is then added with rapid stirring, until a 15% solids emulsion is formed.

This emulsion is electrodeposited anodically on the copper surface of a G-10 copper-clad epoxy/glass laminates at 200V for 10 seconds. A shiny film 0.0011 inch thick is deposited on the copper surface. Electrocoated laminates are baked for 5 minutes at 100° C. and then exposed through a printed circuit test target phototool to UV radiation of a Mimir 9224 printer manufactured by Mimir Corporation, California, for a 2000 to 4000 mj exposures. The imaged laminates are then baked for 10–120 minutes at 100° C. and then developed as in Example 1 in 30° C. 1% aqueous $Na_2CO_3$ for 45 to 60 seconds. Developed samples hold 1–8 steps on a Stouffer 21 step square-root-of-two step wedge, and resolve 0.001 to 0.003 inch lines and spaces on a Stouffer converging resolution wedge.

Samples are etched as in Example 1 to produce good quality etched copper patterns with 0.001 to 0.003 inch line and space resolution.

EXAMPLE 5

The electrocoating process of Example 4 is repeated except that the bath contained no Sudan Blue Dye and the two baking steps are omitted. Good quality etched copper patterns with 0.001 to 0.003 inch line and space resolution are produced.

EXAMPLE 6

The electrocoating processes of Examples 4 and 5 are repeated using poly(MMA/EA/BVEMA/MAA) wherein the polymer component ratio is varied as set out in the following table. Also included in the table are the polymeric properties.

| Polymer | POLY(MMA/EA/BVEMA/MAA Mole %) | | | | $T_g$ | MWn | Acd.# |
| --- | --- | --- | --- | --- | --- | --- | --- |
| | MMA | EA | BVEMA | MAA | | | |
| 1(Ex.3) | 31.7 | 25.8 | 35 | 7.5 | 25 | 7,960 | 52.2 |
| 2 | 19.5 | 35.5 | 35 | 10 | 15 | 12,400 | 53.3 |
| 3(Ex.1) | 23.2 | 34.3 | 35 | 7.5 | 15 | 7,780 | 52.3 |
| 4 | 14 | 43.5 | 35 | 7.5 | 5 | 8,080 | 51 |
| 5 | 26.8 | 33.2 | 35 | 5 | 15 | 9,550 | 36 |
| 6 | 25 | 28 | 35 | 12 | 25 | 14,200 | 87 |
| 7 | 36.8 | 24.2 | 35 | 4 | 25 | 11,600 | 26 |
| 8 | 7.4 | 45.6 | 35 | 12 | 5 | 13,600 | 88.9 |
| 9 | 7.4 | 45.6 | 35 | 12 | 5 | 5,200 | 80.8 |
| 10 | 19.2 | 41.8 | 35 | 4 | 5 | 12,600 | 29.6 |

Holding the polymeric concentration of the acid labile group (BEVMA), the effect of the free acid group (MAA) as well as the other MMA and EA groups on the polymeric acid number and glass transition temperature is demonstrated. For a change in MMA concentration from 4 to 12 there is a change in acid number from about 26 to about 90. Although polymer 8 and polymer 9 have the same stoichiometry, polymer 9 is prepared with 50% additional polymerization initiator leading to the different properties observed.

Even though the polymeric content is varied, good quality etched copper patterns with 0.001 to 0.003 inch line and space resolution are produced from resists containing each of the polymers.

What is claimed is:
1. An aqueous-processable, positive-working, photoresist composition consisting essentially of
a) a polymeric material having

(1) pendant acid labile groups selected from the group consisting of isobornyl ester, alpha-alkoxy alkyl ester, secondary or tertiary alkyl ester and silyl ester and (2) free acid groups having a pKa of at least 2 wherein the free acid groups consist essentially of carboxylic acid groups, wherein the polymeric materials has an acid number of from 25 to 300 and an adherent coating of said material in a thickness within a range of 0.00025 to 0.005 inch on a substrate takes at least 1 minute to be removed when sprayed at 25 to 30 p.s.i. with 1% by weight aqueous sodium carbonate solution at 30° C., and b) a substance comprising 0.1 to 10 weight present of the photoresist composition that forms an acid having a pKa equal to or less than 2 upon exposure to actinic radiation.

2. The composition of claim 1 wherein the acid number is not greater than 100 and substance b) is present in an amount of from 0.5 to 6% in the composition.

3. The composition of claim 1 wherein the pendant acid labile group is unsubstituted or substituted isobornyl or norbornyl esters wherein substitution is by at least one alkyl or alkoxy groups having 1 to 4 carbon atoms, or an alpha-alkoxy alkyl ester group represented by the formula:

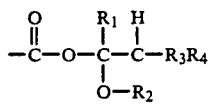

or

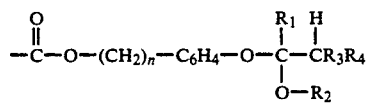

where n is an integer of 0 to 4; $R_1$ is hydrogen or lower alkyl of 1 to 6 carbon atoms; $R_2$ is lower alkyl of 1 to 6 carbon atoms; and $R_3$ and $R_4$ independently are hydrogen or lower alkyl of 1 to 6 carbon atoms or $R_1$ and $R_2$, or $R_1$ and either $R_3$ or $R_4$, or $R_2$ and either $R_3$ or $R_4$ taken together form a 5-, 6-, or 7-membered ring.

4. The composition of claim 3 wherein the pendant acid labile group is 6-isobornyl methacrylate or acrylate.

5. The composition of claim 3 wherein the pendant acid labile group is 1-ethoxyethyl methacrylate or acrylate; 1-butoxyethyl methacrylate or acrylate; 1-ethoxy-1-propyl methacrylate or acrylate; tetrahydropyranyl methacrylate or acrylate; tetrahydropyranyl p-vinylbenzoate; 1-ethoxy-1-propyl p-vinylbenzoate; tetrahydropyranoxy-4-benzyl methacrylate or acrylate or 1-butoxyethoxy-4-benzyl methacrylate or acrylate.

6. The composition of claim 1 wherein the carboxylic acid group is acrylic acid, methacrylic acid, maleic acid, its half ester or half amide; fumaric acid, its half ester or half amide; and itaconic acid, its half ester or half amide.

7. The composition of claim 1 wherein the polymeric material is a copolymer.

8. The composition of claim 1 wherein the copolymer is formed from a monomer of methyl methacrylate, ethyl methacrylate, propyl methacrylate, butyl methacrylate, benzyl methacrylate, methyl acrylate, ethyl acrylate, propyl acrylate, butyl acrylate, N-butylacrylamide, N-octylacrylamide, acrylonitrile, styrene, p-methyl styrene, butadiene or isoprene.

9. The composition of claim 1 wherein the substance that forms an acid upon exposure to actinic radiation comprises an initiator that decomposes to form the acid.

10. The composition of claim 9 wherein the initiator is a diazonium salt, diaryliodonium salt or triarylsulfonium salt of a complex metal halides ion of tetrafluoroborate, hexafluoroantimonate, hexafluoroarsenate, and hexafluorophosphate.

11. The composition of claim 1 wherein the substance that forms an acid upon exposure to actinic radiation comprises an initiator that decomposes to form the acid and a spectral sensitizer that absorbs actinic radiation and sensitizes the initiator.

12. The composition of claim 11 wherein the spectral sensitizer is benzophenone, perylene, pyrene, anthracene, or derivative thereof.

* * * * *